(12) United States Patent
Yaegashi et al.

(10) Patent No.: US 11,205,571 B2
(45) Date of Patent: Dec. 21, 2021

(54) MASK FORMING METHOD

(71) Applicant: TOKYO ELECTRON LIMITED, Tokyo (JP)

(72) Inventors: Hidetami Yaegashi, Tokyo (JP); Soichiro Okada, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 274 days.

(21) Appl. No.: 16/575,674

(22) Filed: Sep. 19, 2019

(65) Prior Publication Data

US 2020/0090927 A1 Mar. 19, 2020

(30) Foreign Application Priority Data

Sep. 19, 2018 (JP) .............................. JP2018-175200

(51) Int. Cl.
*H01L 21/027* (2006.01)
*G03F 7/40* (2006.01)
*G03F 7/039* (2006.01)

(52) U.S. Cl.
CPC .......... *H01L 21/0273* (2013.01); *G03F 7/039* (2013.01); *G03F 7/40* (2013.01)

(58) Field of Classification Search
CPC ... G03F 7/40; G03F 7/327; G03F 7/36; G03F 7/325; G03F 7/039; G03F 7/0392; G03F 7/0395; G03F 7/0397; G03F 7/34; G03F 7/30; H01L 21/0273
See application file for complete search history.

(56) References Cited

U.S. PATENT DOCUMENTS

| | | | |
|---|---|---|---|
| 2001/0053590 A1* | 12/2001 | Jung ......................... | G03F 7/36 438/584 |
| 2006/0003271 A1* | 1/2006 | Clark ...................... | G03F 7/327 430/329 |
| 2007/0258712 A1* | 11/2007 | Moffat ...................... | G03F 7/36 396/536 |
| 2009/0208852 A1* | 8/2009 | Shimura ........... | H01L 21/32139 430/5 |
| 2010/0068657 A1* | 3/2010 | Yang ................... | H01L 21/0273 430/323 |

FOREIGN PATENT DOCUMENTS

JP 2000131854 A 5/2000

\* cited by examiner

*Primary Examiner* — John A McPherson
*Assistant Examiner* — Nicholas E Brown
(74) *Attorney, Agent, or Firm* — Nath, Goldberg & Meyer; Jerald L. Meyer; Tanya E. Harkins

(57) ABSTRACT

There is provided a mask forming method, including: forming a photosensitive organic film on a workpiece; generating a first region and a second region in the photosensitive organic film by performing a selective exposure and a post-exposure baking on the photosensitive organic film, the first region having an acidic functional group in the photosensitive organic film, and the second region having a protective group in which the acidic functional group is protected; forming a salt in the first region by causing a basic substance to permeate into the first region using a substance staying in a gaseous state or a solid state; and removing the first region by dissolving the salt in a developer.

7 Claims, 20 Drawing Sheets

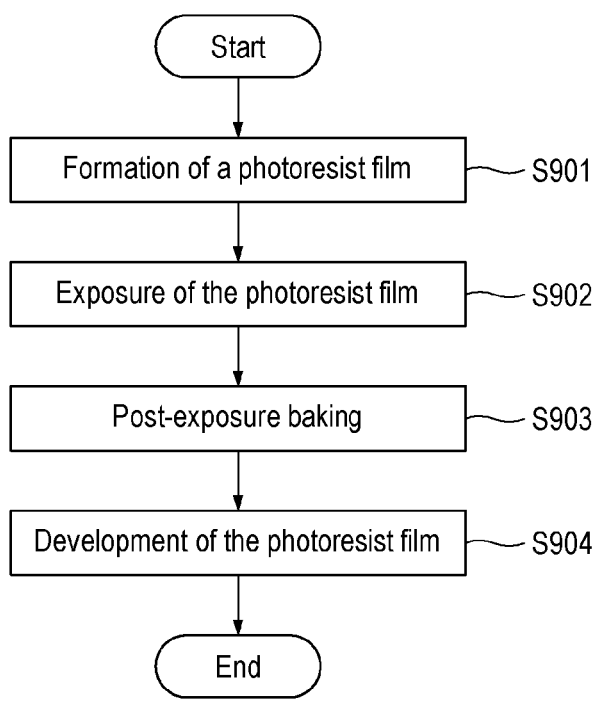

← NH₃ (+H₂O)

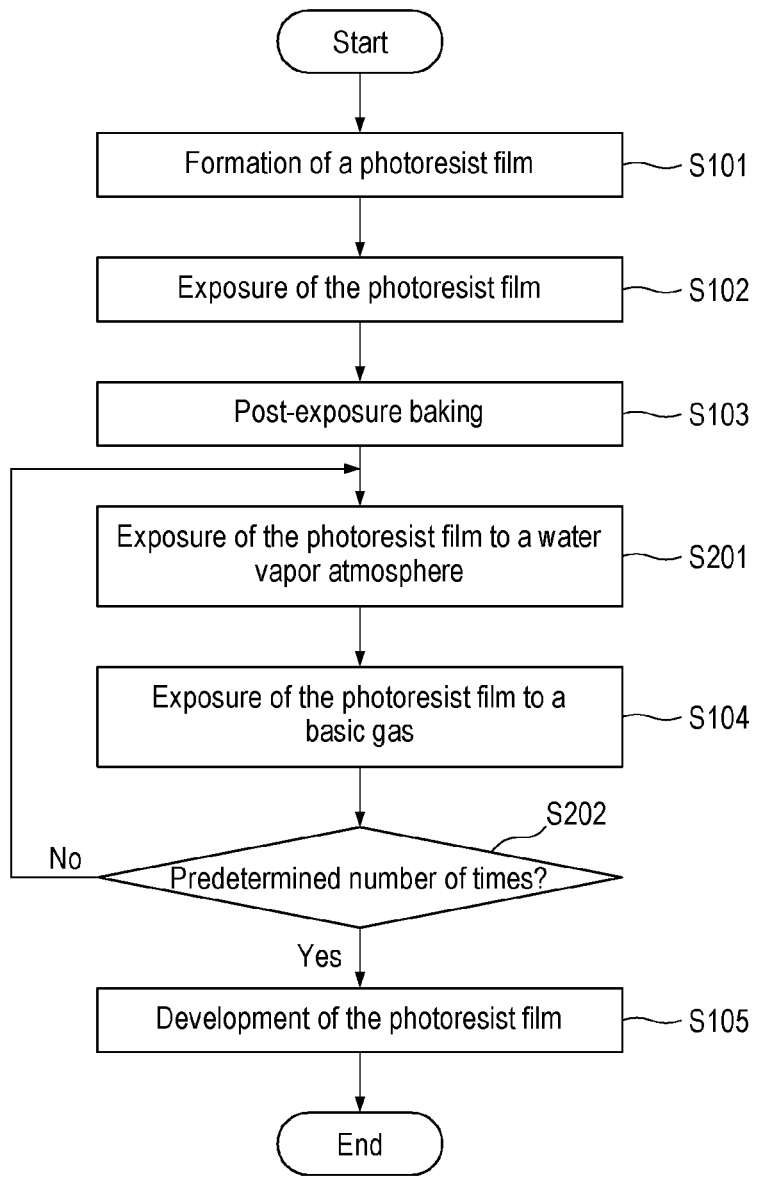

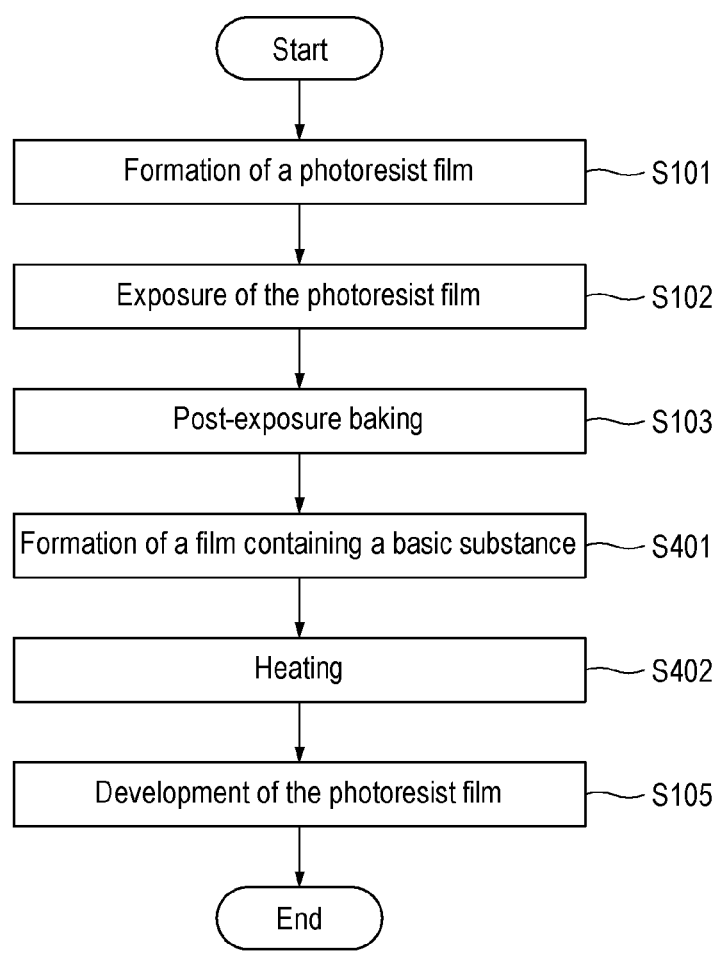

MASK FORMING METHOD

CROSS-REFERENCE TO RELATED APPLICATION

This application is based upon and claims the benefit of priority from Japanese Patent Application No. 2018-175200, filed on Sep. 19, 2018, the entire contents of which are incorporated herein by reference.

TECHNICAL FIELD

The present disclosure relates to a mask forming method.

BACKGROUND

Along with the high integration of semiconductor devices, the pattern formed on a resist mask used for manufacturing a semiconductor device has been miniaturized. The finer the pattern, the higher the accuracy required. For example, there is disclosed a method of permeating a basic substance to a resist surface prior to post-exposure baking in order to suppress defects of the resist surface caused by a catalytic reaction of an acid generated in air which is an exposure atmosphere.

PRIOR ART DOCUMENT

Patent Documents

Patent Document 1: Japanese Laid-Open Patent Publication No. 2000-131854

SUMMARY

According to one embodiment of the present disclosure, there is provided a mask forming method, including: forming a photosensitive organic film on a workpiece; generating a first region and a second region in the photosensitive organic film by performing a selective exposure and a post-exposure baking on the photosensitive organic film, the first region having an acidic functional group in the photosensitive organic film, and the second region having a protective group in which the acidic functional group is protected; forming a salt in the first region by causing a basic substance to permeate into the first region using a substance staying in a gaseous state or a solid state; and removing the first region by dissolving the salt in a developer.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart showing a reference example of a mask forming method.

FIG. 16 is a flowchart showing a mask forming method according to a second embodiment.

FIG. 18 is a flowchart showing a mask forming method according to a fourth embodiment.

DETAILED DESCRIPTION

Figure 2A:
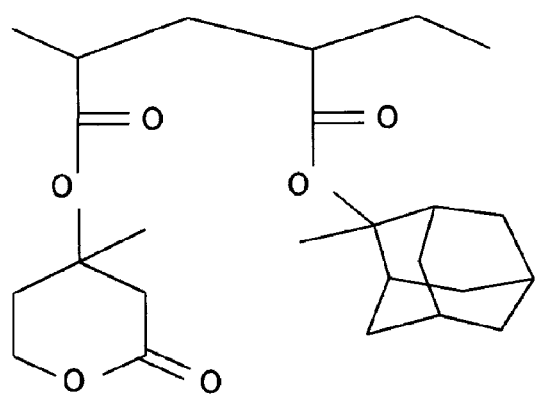
FIGS. 2A, 2B and 2C are views showing a change of a structural formula of a photoresist film in the reference example.

Embodiments will be specifically described below with reference to the accompanying drawings. In the subject specification and the drawings, components having substantially identical functions and configurations will be designated by like reference numerals with the duplicate descriptions thereof omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Reference Example

First, a reference example will be described. FIG. 1 is a flowchart showing a reference example of a mask forming method.

The reference example includes a step of forming a photoresist film (step S901), a step of exposing the photoresist film (step S902), a step of performing post-exposure baking (PEB) (step S903), and a step of developing the photoresist film (step S904).

The respective steps will be specifically described below. FIGS. 2A, 2B, 2C, and FIGS. 3A, 3B and 3C are views showing changes of the structural formula of the photoresist film in the reference example.

In step S901, a photoresist film is formed on a workpiece. In the reference example, a positive photoresist film is used as the photoresist film. The photoresist film contains, for example, a base resin and a photo acid generator (PAG). As shown in FIG. 2A, the base resin has a protective group with low polarity. The protective group is, for example, a lactone group, an adamantyl group or both.

In step S902, the photoresist film is selectively exposed using an exposure mask. That is, the photoresist film is selectively irradiated with exposure light. As a result, an exposed region is formed in the photoresist film while leaving an unexposed region. Since the photoresist film is positive, the photo acid generator is decomposed in the exposed region to generate an acid.

Figure 2B:
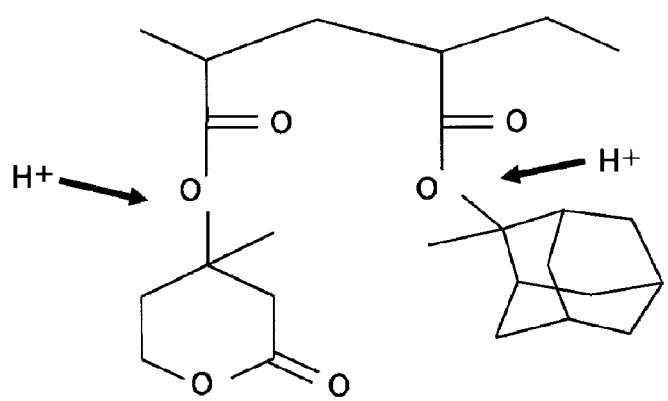
Figure 2C:
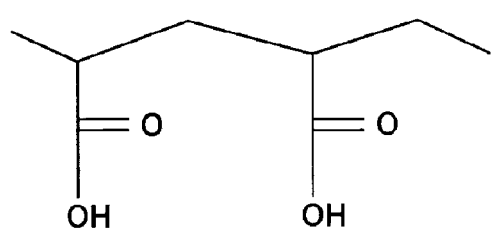

In step S903, the photoresist film is subjected to the post-exposure baking. By the post-exposure baking, the acid is diffused in the exposed region. As shown in FIG. 2B, the base resin contained in the photoresist film is deprotected. As a result, in the exposed region, as shown in FIG. 2C, the base resin is deprotected to generate a carboxyl group.

Figure 3A:
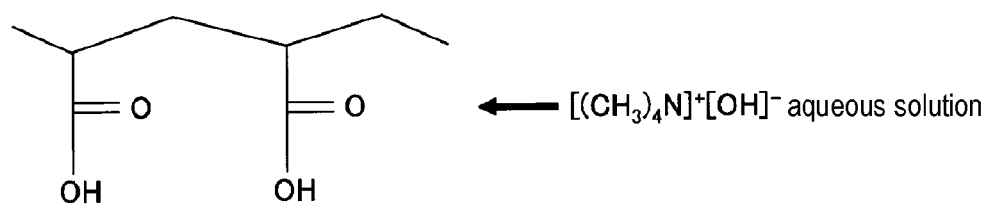
FIGS. 3A, 3B and 3C are views showing a change of the structural formula of the photoresist film in the reference example.

In step S904, the photoresist film is developed. In this development, for example, as shown in FIG. 3A, an aqueous solution of tetramethylammonium hydroxide (TMAH) is used as a developer.

Figure 3B:
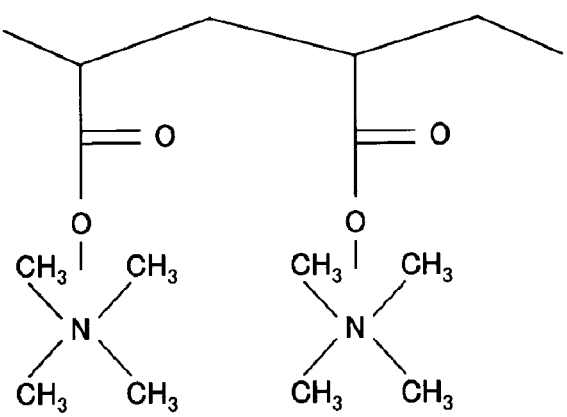
Figure 3C:
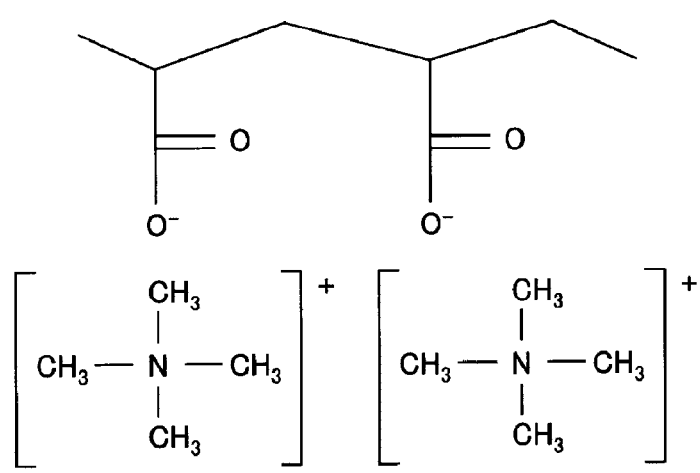

In general, the deprotected photoresist film is said to be soluble in the aqueous solution of TMAH because of its high polarity. However, the deprotected photoresist film is difficult to dissolve in the aqueous solution of TMAH as it is. In fact, as shown in FIG. 3B, a salt of the carboxyl group of the photoresist film and $[(CH_3)_4N]+$ is formed between the deprotected photoresist film and the aqueous solution of TMAH. Then, as shown in FIG. 3C, the salt is dissolved in water and ionized. Thus, the deprotected photoresist film is soluble in water.

Figure 6A:
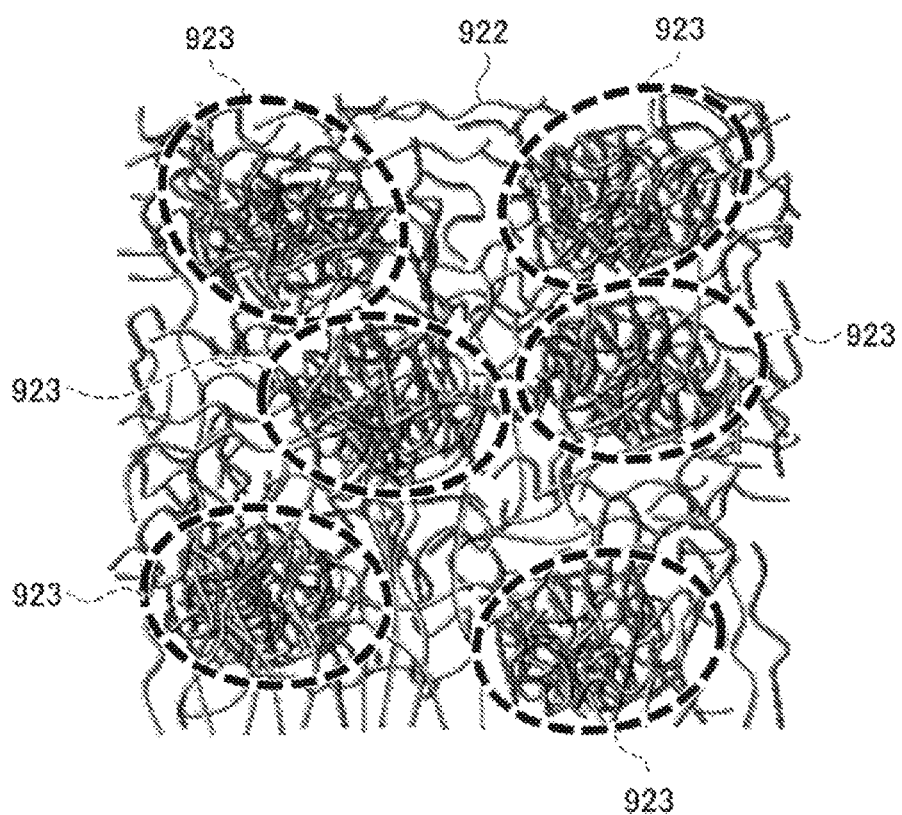
FIGS. 6A and 6B are schematic views showing a decomposition process of the photoresist film in the reference example.
Figure 6B:
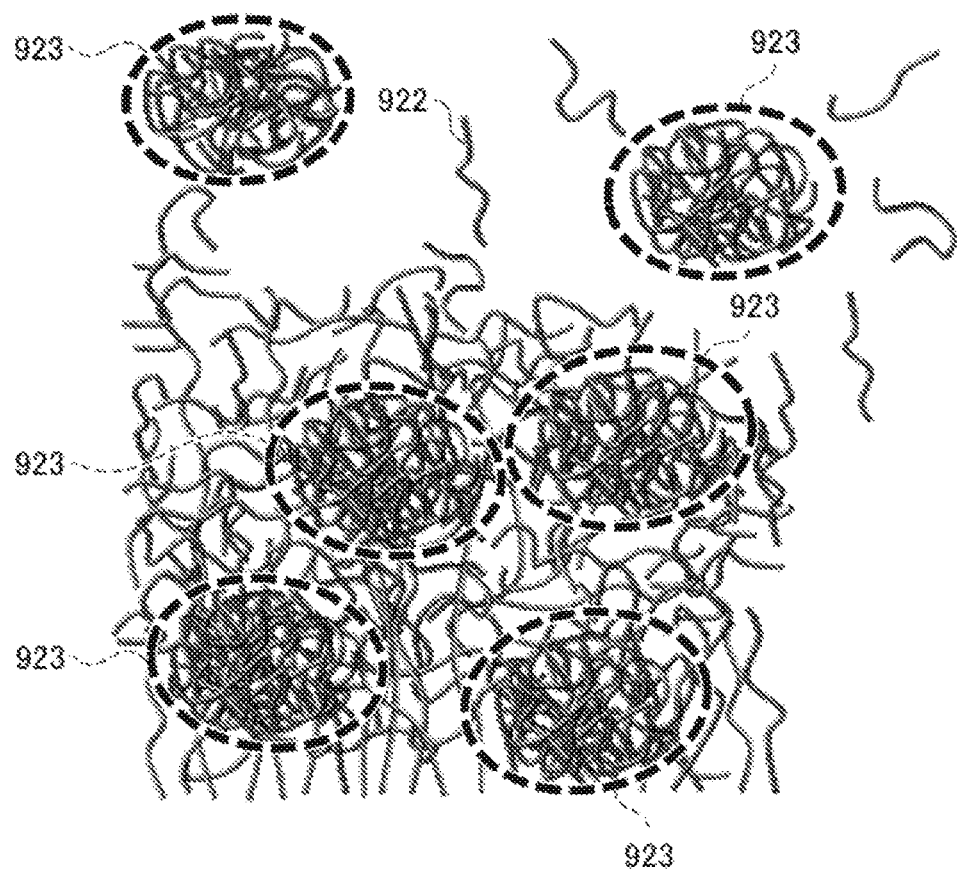
Figure 7A:
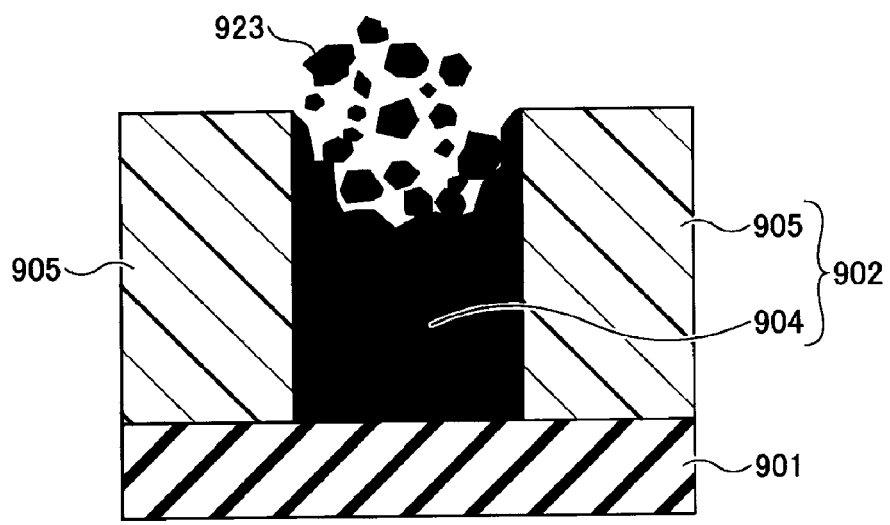
FIGS. 7A and 7B are sectional views showing a removal process of an exposed region in the reference example.
Figure 7B:
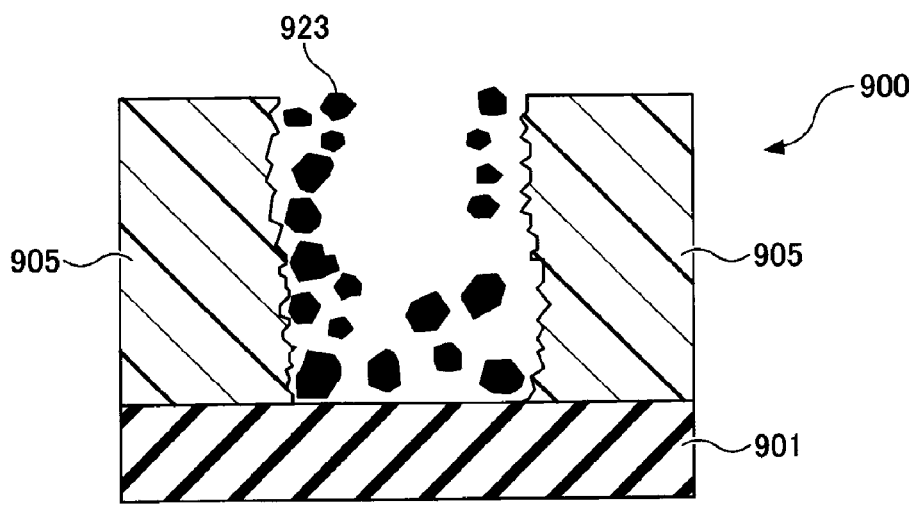

A decomposition process of the photoresist film in the reference example will be described with reference to schematic views. FIGS. 4A, 4B, and FIGS. 5A and 5B are schematic views showing changes of the interior of the photoresist film in the reference example. FIGS. 6A and 6B are schematic views showing a decomposition process of the photoresist film in the reference example. FIGS. 7A and 7B are sectional views showing a removal process of the exposed region in the reference example.

Figure 4A:
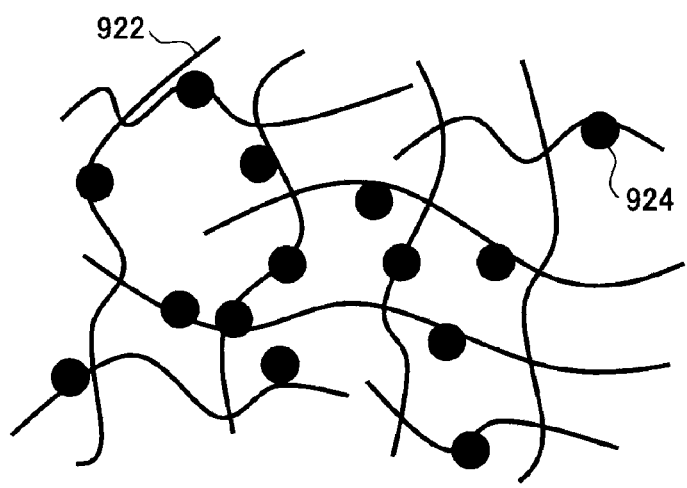
FIGS. 4A and 4B are schematic views showing a change of the interior of the photoresist film in the reference example.
Figure 4B:
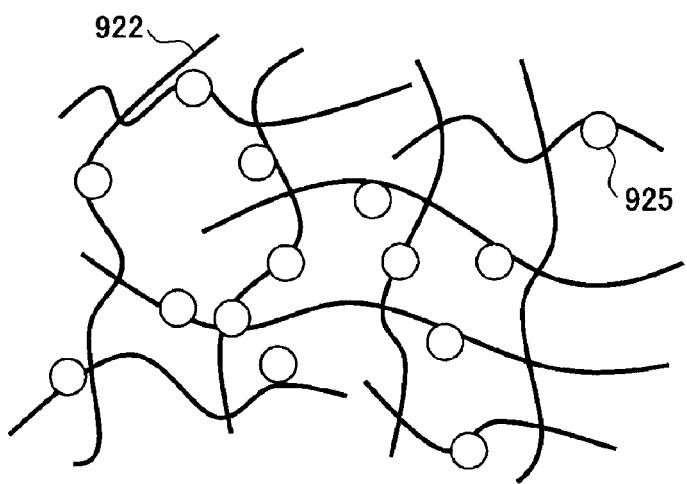

As shown in FIG. 4A and FIG. 6A, a photoresist film 902 is configured by a plurality of molecular chains 922 entangled with each other. The photoresist film 902 includes agglomerated portions 923 of the molecular chains 922. In addition, the molecular chains 922 have protective groups 924 at a stage before exposure. When the exposure is performed, as shown in FIG. 4B, the base resin is deprotected in the exposed region to generate deprotected groups 925 such as carboxyl groups or the like.

Figure 5A:
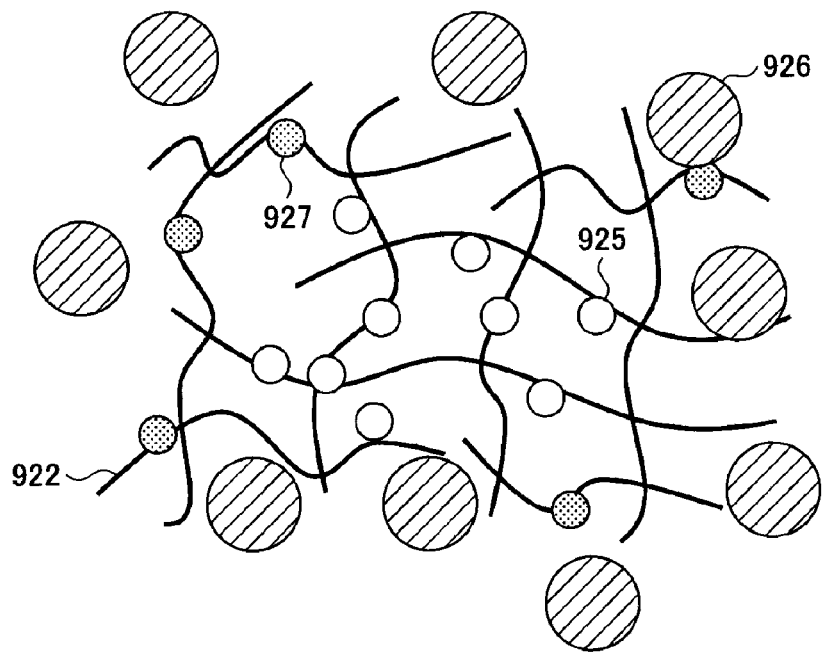
FIGS. 5A and 5B are schematic views showing a change of the interior of the photoresist film in the reference example.
Figure 5B:
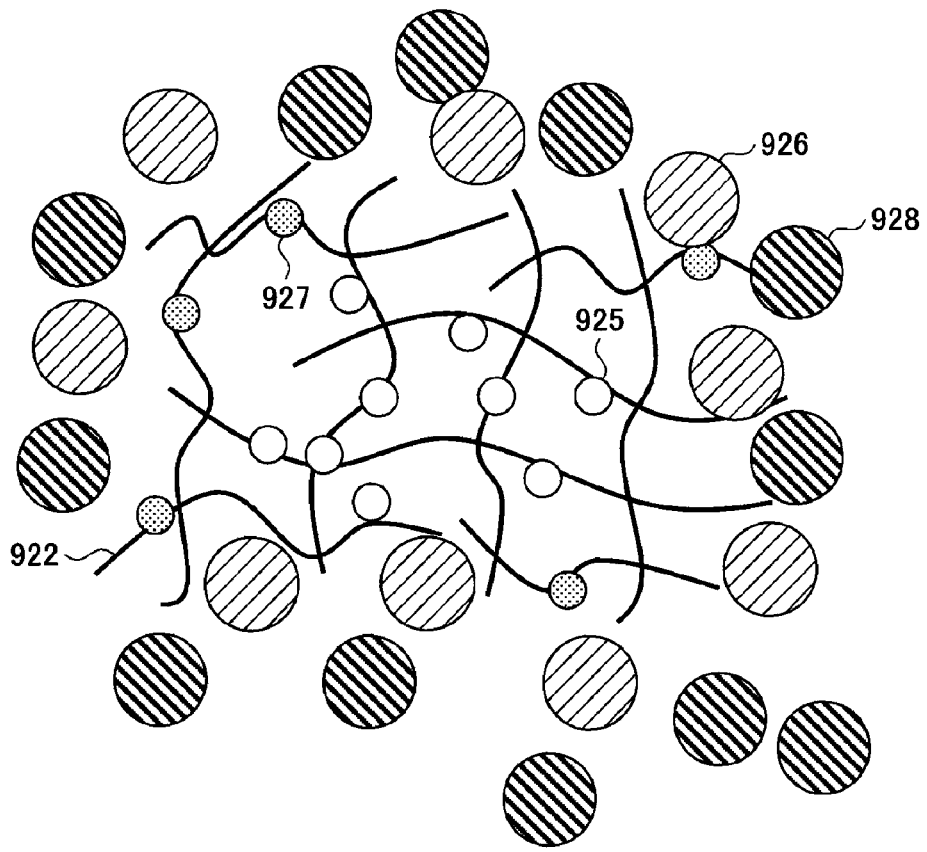

In a subsequent development, as shown in FIG. 5A, salts 927 are generated by the reaction of the deprotected groups 925 and the aqueous solution of TMAH 926. The salts 927 are likely to be generated on the surface of the agglomerated portions 923, but the salts 927 are difficult to be generated inside the agglomerated portions 923. As shown in FIG. 5B, the salts 927 thus generated are dissolved in water 928 of the aqueous solution of TMAH 926. For this reason, as shown in FIG. 6B, some of the agglomerated portions 923 are removed in a lump-shaped form before the salts 927 are generated therein.

Therefore, at the time of development, as shown in FIG. 7A, in the photoresist film 902 formed on a workpiece 901, the agglomerated portions 923 having a lump shape are detached from the exposed region 904. As a result, as shown in FIG. 7B, a large uneven portion is formed on the side surface of the unexposed region 905. For this reason, the accuracy of the pattern of the mask 900 formed in the reference example becomes low. In particular, in a line-and-space (L/S) pattern, LER (Line Edge Roughness) tends to increase. In addition, scum may be generated as a result of the detachment of the agglomerated portions 923 having a lump shape.

First Embodiment

Figure 8:
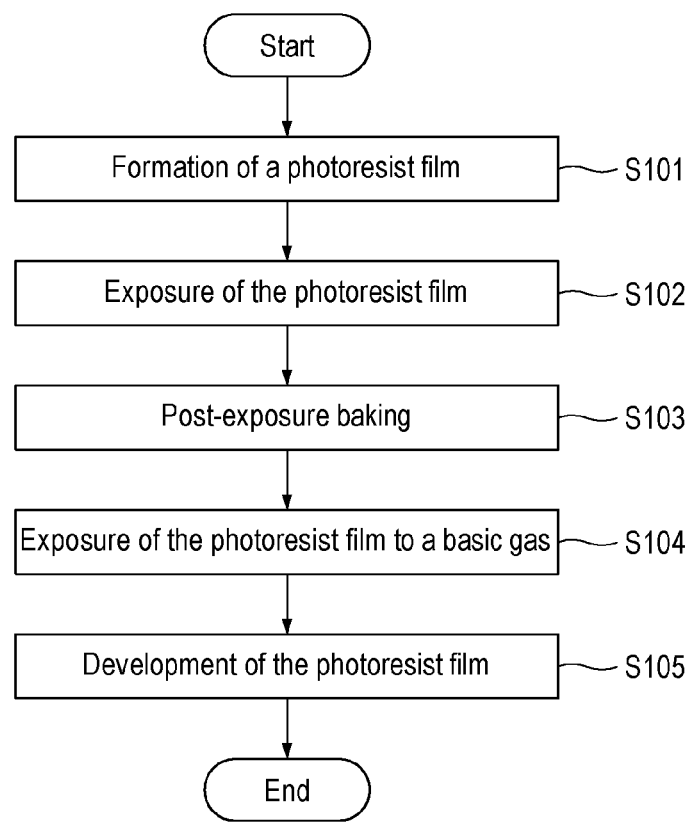
FIG. 8 is a flowchart showing a mask forming method according to a first embodiment.

Next, a first embodiment will be described. FIG. 8 is a flowchart showing a mask forming method according to a first embodiment.

The mask forming method according to the first embodiment includes a step of forming a photoresist film (step S101), a step of exposing the photoresist film (step S102), and a step of performing post-exposure baking (step S103). The mask forming method according to the first embodiment further includes a step of exposing the photoresist film to a basic gas (step S104) and a step of developing the photoresist film (step S105).

Hereinafter, the respective steps will be specifically described. FIGS. 9A, 9B and 9C, and FIGS. 10A, 10B and 10C are sectional views showing the mask forming method according to the first embodiment. FIGS. 11A, 11B and 11C are views showing a change of the structural formula of the photoresist film in the first embodiment.

Figure 9A:
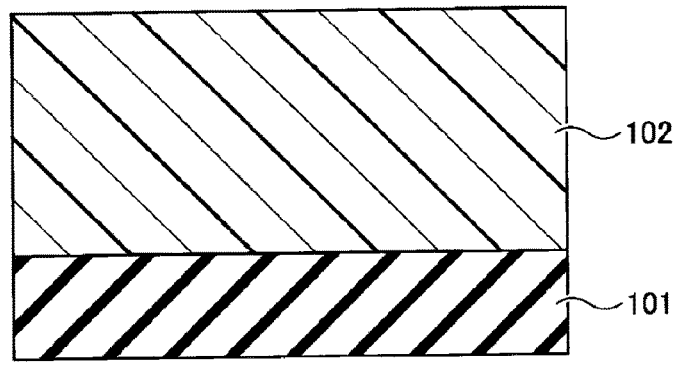
FIGS. 9A, 9B and 9C are sectional views showing the mask forming method according to the first embodiment.

In step S101, as shown in FIG. 9A, a photoresist film 102 is formed on a workpiece 101. In the first embodiment, a positive photoresist film is used as the photoresist film 102. The photoresist film 102 is made of a chemically amplified photoresist such as a KrF resist, an ArF resist or an extreme ultraviolet (EUV) resist. Similar to the photoresist film used in the reference example, the photoresist film 102 contains, for example, a base resin and a photo acid generator. The base resin has a protective group with low polarity (see FIG. 2A). The protective group is, for example, a lactone group, an adamantyl group or both. For example, the photoresist film 102 can be formed by a spin coating method. The photoresist film 102 is an example of a photosensitive organic film.

Figure 9B:
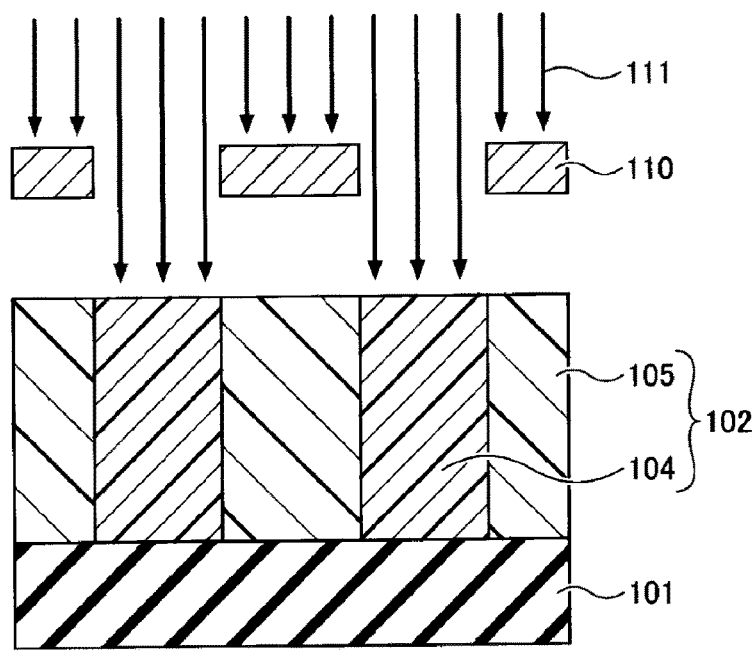

In step S102, as shown in FIG. 9B, the photoresist film 102 is selectively exposed using an exposure mask 110. That is, the photoresist film 102 is selectively irradiated with exposure light 111. As a result, an exposed region 104 is formed in the photoresist film 102 while leaving an unexposed region 105. Since the photoresist film 102 is positive, the photo acid generator is decomposed in the exposed region 104 to generate an acid. A light source used for exposure is determined according to a material of the photoresist film 102, and is, for example, a KrF excimer laser (having a wavelength of 248 nm), an ArF excimer laser (having a wavelength of 193 nm), or an EUV excimer laser (having a wavelength of 13.5 nm).

Figure 9C:
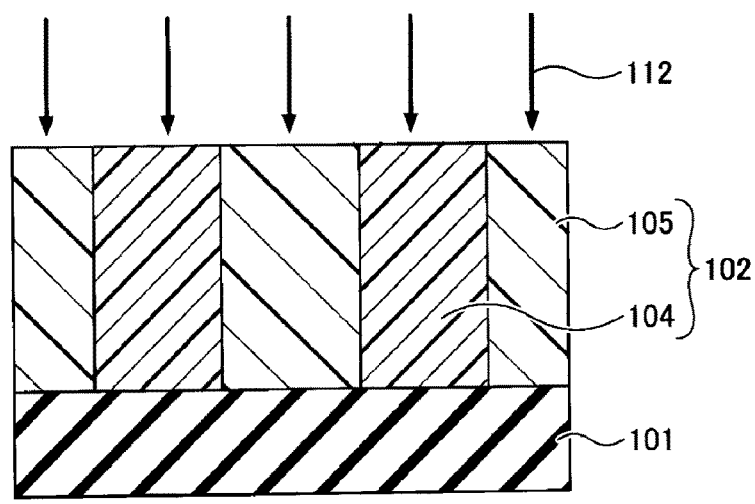

In step S103, as shown in FIG. 9C, heat 112 is applied to perform post-exposure baking on the photoresist film 102. In the post-exposure baking, the photoresist film 102 is heated to a temperature of, for example, 100 degrees C. to 150 degrees C. to diffuse the acid in the exposed region 104, thereby deprotecting the base resin contained in the photoresist film 102 (see FIG. 2B). As a result, in the exposed region 104, the base resin is deprotected to generate carboxyl groups (see FIG. 2C). The exposed region 104 is an example of a first region having an acidic functional group, and the unexposed region 105 is an example of a second region having a protective group which protects an acidic functional group.

Figure 10A:
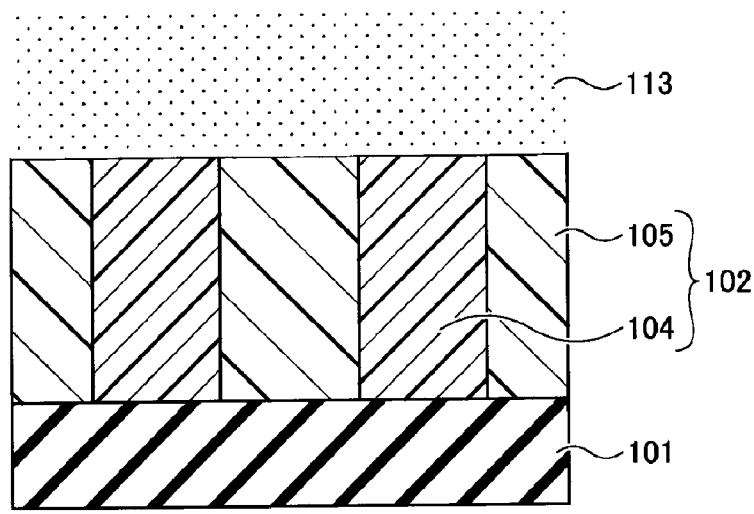
FIGS. 10A, 10B and 10C are sectional views showing the mask forming method according to the first embodiment.
Figure 10B:
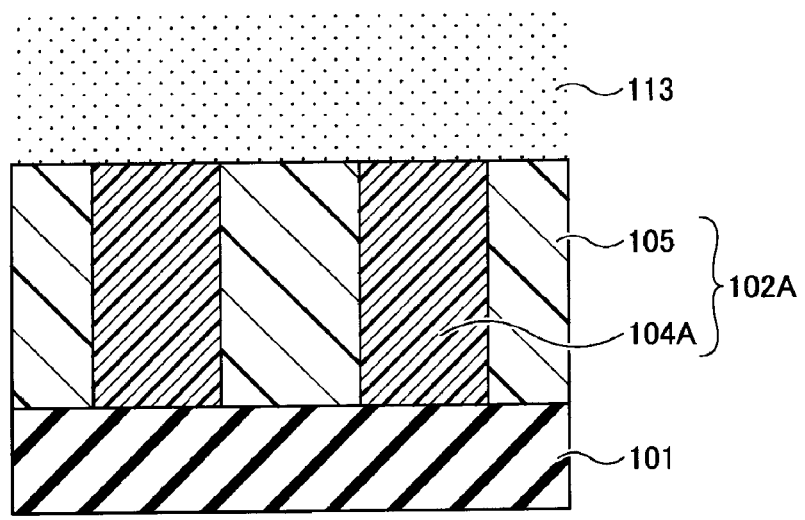
Figure 11A:
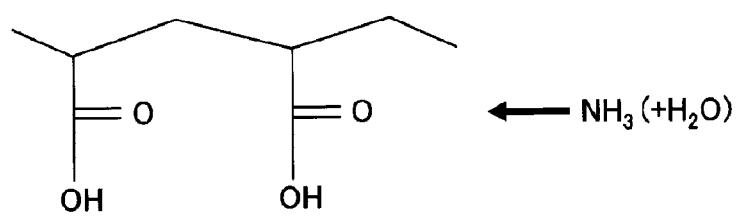
FIGS. 11A, 11B and 11C are views showing a change of a structural formula of a photoresist film in the first embodiment.
Figure 11B:
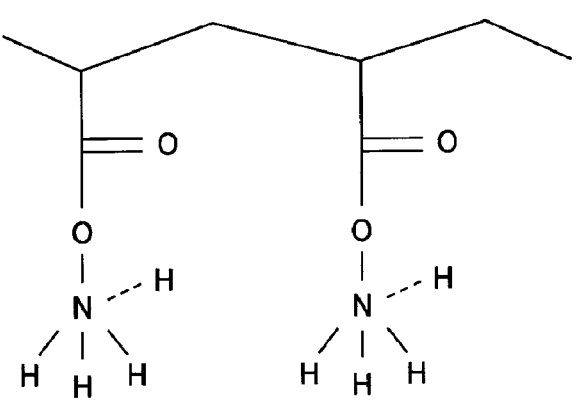
Figure 11C:
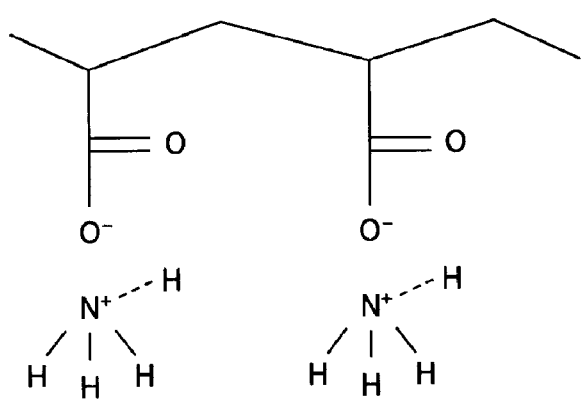

In step S104, as shown in FIG. 10A, the photoresist film 102 is exposed to a basic gas 113 (in a gaseous gas). For example, as the basic gas 113, it may be possible to use ammonia, methylamine, ethylamine, morpholine, pyridine, or an arbitrary combination thereof. A basic substance contained in the basic gas 113 can penetrate at least the exposed region 104. When ammonia is used as the basic gas as shown in FIG. 11A, an ammonium salt is generated by the reaction of the carboxyl group of the deprotected photoresist film 102 and the ammonia as shown in FIG. 11B. This ammonium salt is soluble in water. Since there is no water around the ammonium salt, the ammonium salt remains solid. In this way, as shown in FIG. 10B, a solid photoresist film 102A in which the exposed region 104 becomes a water-soluble region 104A is obtained.

Figure 10C:
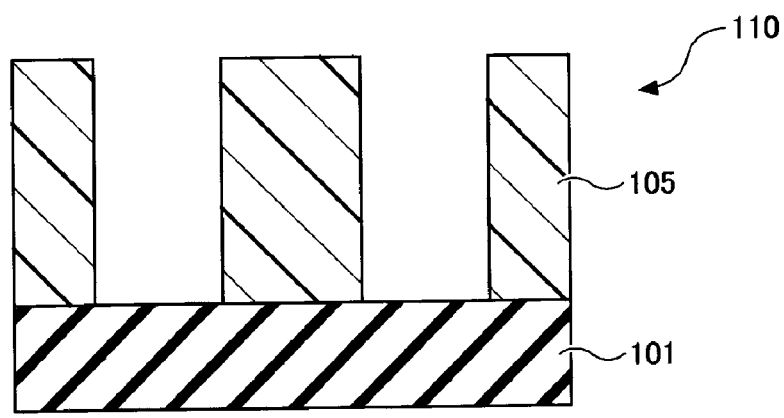

In step S105, the photoresist film 102A is developed. In this development, for example, water is used as a developer. As a result of the development, as shown in FIG. 10C, the water-soluble region 104A (the exposed region 104) is removed while leaving the unexposed region 105.

In this way, a mask 100 can be formed.

Figure 13A:
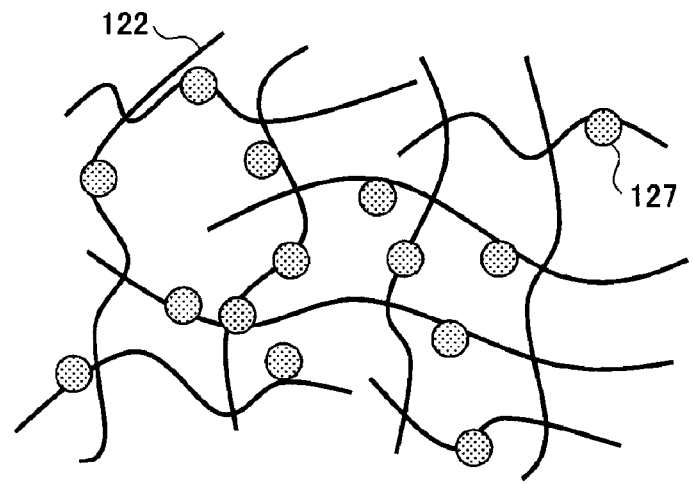
FIGS. 13A and 13B are schematic views showing a change of the interior of the photoresist film in the first embodiment.

A decomposition process of the photoresist film 102 in the first embodiment will be described with reference to schematic views. FIGS. 12A and 12B, and FIGS. 13A and 13B are schematic views showing changes of the interior of the photoresist film 102 in the first embodiment. FIGS. 14A and 14B are schematic views showing a decomposition process of the photoresist film in the first embodiment. FIGS. 15A and 15B are sectional views showing a removal process of the exposed region in the first embodiment.

Figure 12A:
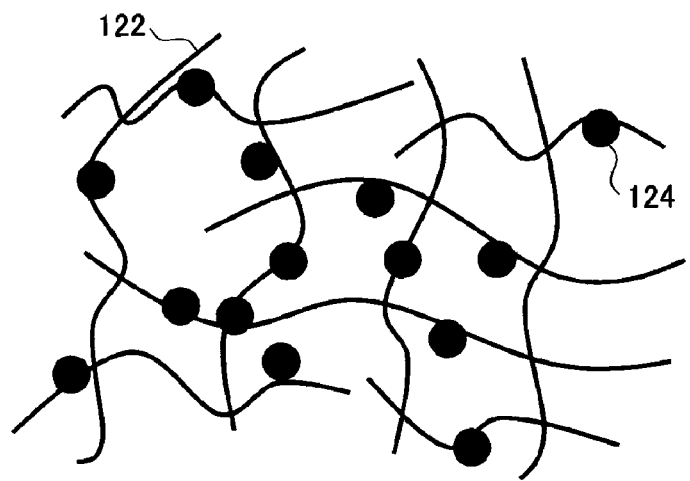
FIGS. 12A and 12B are schematic views showing a change of the interior of the photoresist film in the first embodiment.
Figure 12B:
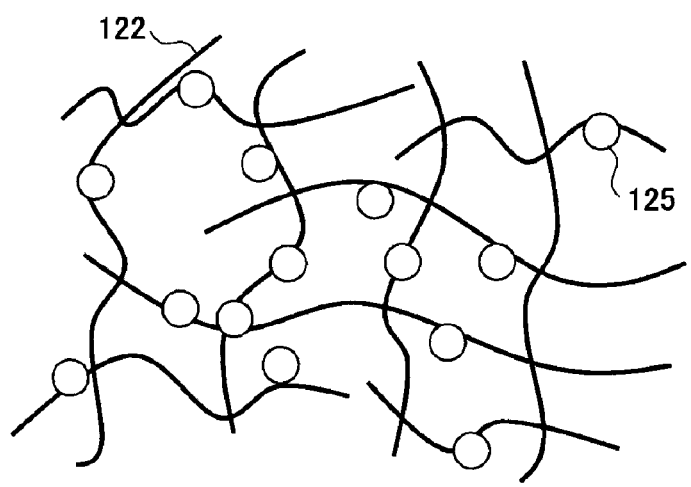

As shown in FIG. 12A and FIG. 14A, the photoresist film 102 is configured by a plurality of molecular chains 122 entangled with each other. The photoresist film 102 includes agglomerated portions 123 of the molecular chains 122. In addition, the molecular chains 122 have protective groups 124 at a stage before exposure. When the exposure is performed, as shown in FIG. 12B, the base resin is deprotected in the exposed region to generate deprotected groups, for example, carboxyl groups 125 in the first embodiment.

Thereafter, by the exposure of the photoresist film 102 to the basic gas 113, the basic substance contained in the basic gas 113 permeates into at least the exposed region 104. As shown in FIG. 13A, salts 127 are generated by the reaction of the carboxyl groups 125 and the basic substance. Since this reaction is performed outside water, the salts 127 do not dissolve in water. Even inside the agglomerated portions 123, the salts 127 can be generated by causing the carboxyl groups 125 to sufficiently react with the basic substance.

Figure 13B:
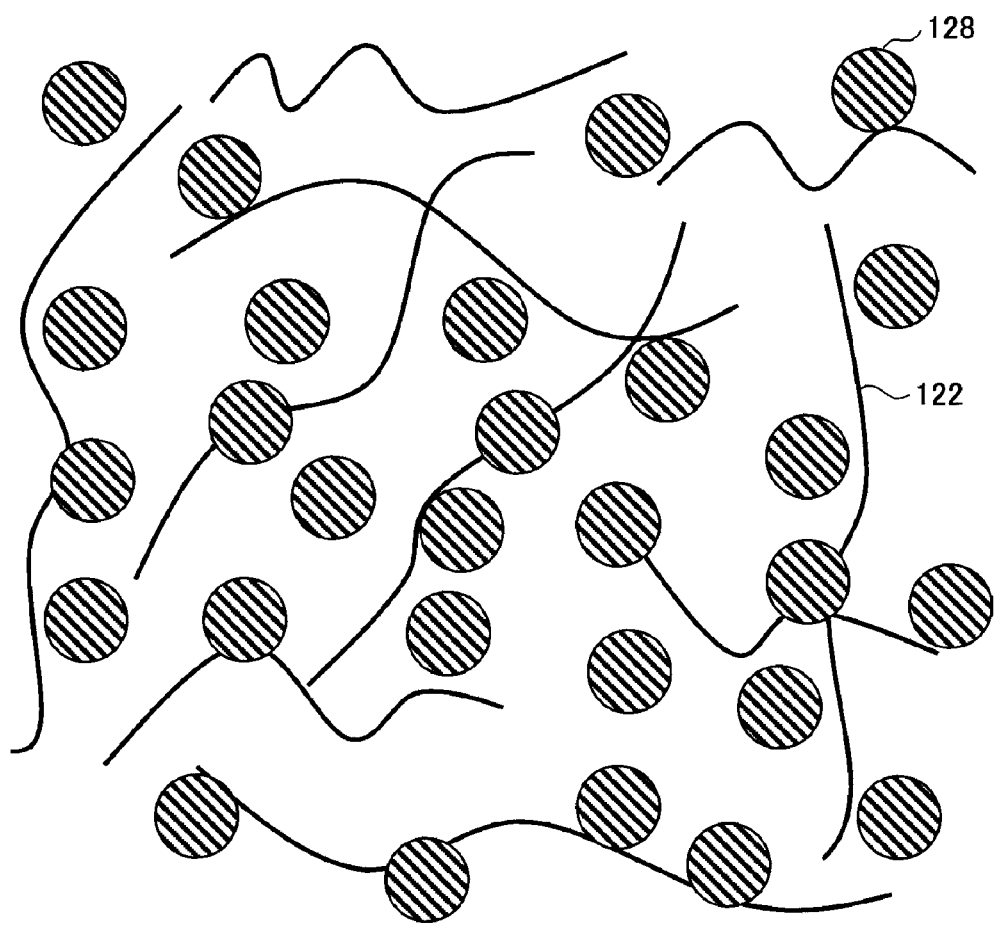
Figure 14A:
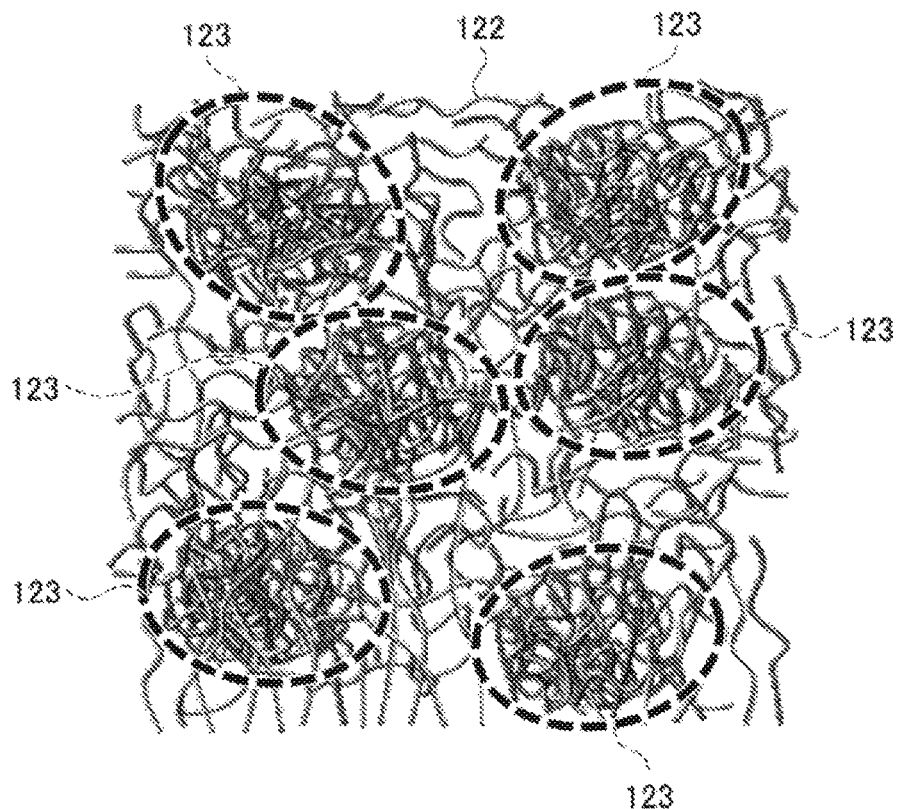
FIGS. 14A and 14B are schematic view showing a decomposition process of the photoresist film in the first embodiment.
Figure 14B:
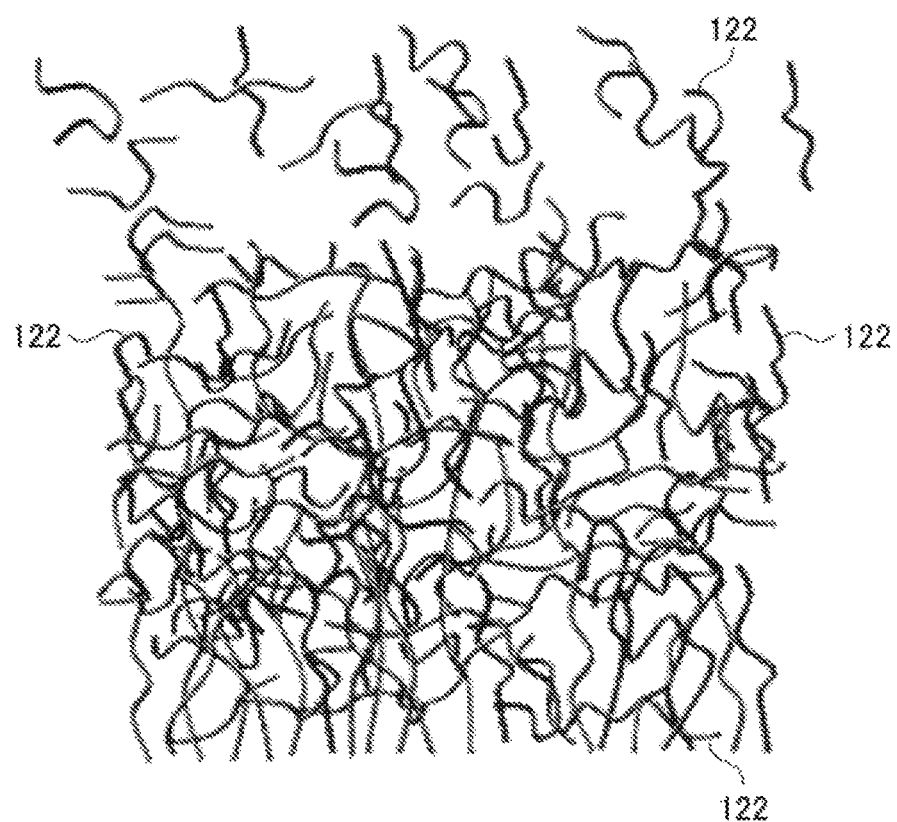
Figure 15A:
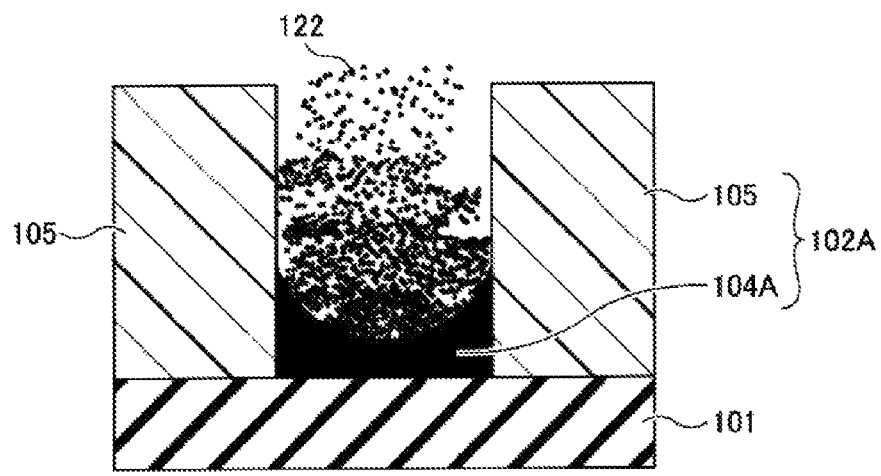
FIGS. 15A and 15B are sectional views showing a removal process of an exposed region in the first embodiment.
Figure 15B:
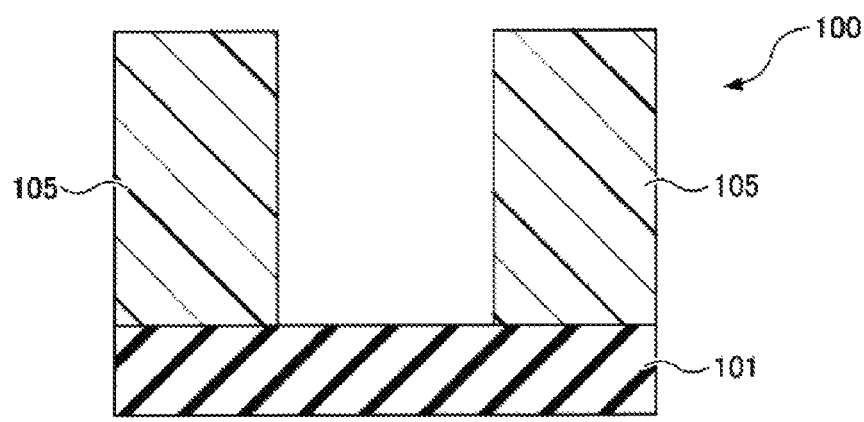

At the time of development, as shown in FIGS. 13B and 14B, the salts 127 are dissolved in the water 128 in the entire water-soluble region 104A (exposed region 104). The water-soluble region 104A is removed as the agglomerated portions 123 are dissolved.

Accordingly, as shown in FIG. 15A, fine molecular chains 122 are detached from the water-soluble region 104A (exposed region 104). Consequently, as shown in FIG. 15B, the unevenness on the side surface of 105 becomes extremely small. As described above, according to the first embodiment, it is possible to form the mask 100 onto which the pattern of the exposure mask 110 is transferred with high accuracy. In particular, in a line-and-space pattern, the LER can be kept small. Moreover, the occurrence of scum can be suppressed.

This effect is particularly remarkable when a fine pattern mask is formed using EUV as exposure light. This is because, when the roughness of the side surface of the unexposed region 105 is the same, the influence of the roughness becomes relatively larger as the pattern becomes finer. Therefore, the present embodiment is extremely effective in forming a fine pattern mask using EUV.

The exposure of the photoresist film 102 to the basic gas 113 in step S104 may be performed in an atmosphere containing a water vapor. This is because water penetrates into the exposed region 104 and the hydrolysis of the basic substance is promoted in the exposed region 104.

Second Embodiment

Next, a second embodiment will be described. FIG. 16 is a flowchart illustrating a mask forming method according to a second embodiment.

The mask forming method according to the second embodiment includes a step of forming a photoresist film (step S101), a step of exposing the photoresist film (step S102) and a step of performing post-exposure baking (step S103). The mask forming method according to the second embodiment further includes a step of exposing the photoresist film to a water vapor atmosphere (step S201), a step of exposing the photoresist film to a basic gas (step S104) and a step of developing the photoresist film (step S105).

Hereinafter, the respective steps will be specifically described.

In steps S101 to S103, as in the first embodiment, the formation, exposure and post-exposure baking of the photoresist film 102 are performed (see FIGS. 9A to 9C).

In step S201, the photoresist film 102 is exposed to the water vapor atmosphere. By exposing the photoresist film 102 to the water vapor atmosphere, water penetrates into at least the exposed region 104.

In step S104, as in the first embodiment, the photoresist film 102 is exposed to the basic gas 113 (see FIGS. 10A and 10B). As a result, as in the first embodiment, the solid photoresist film 102A in which the exposed region 104 becomes the water-soluble region 104A is obtained. In the present embodiment, water penetrates into the exposed region 104 prior to the exposure to the basic gas 113. Therefore, the hydrolysis of the basic substance is promoted in the exposed region 104. Accordingly, the exposed region 104 can be made the water-soluble area 104A in a more reliable manner.

Steps S201 and S104 are performed a predetermined number of times (step S202). The predetermined number of times may be one time or two or more times.

In step S105, the photoresist film 102A is developed as in the first embodiment (see FIG. 10C).

In this way, the mask 100 can be formed.

According to the second embodiment, as described above, the hydrolysis of the basic substance is promoted by the permeation of water into the exposed region 104. Therefore, the exposed region 104 can be made the water-soluble region 104A in a more reliable manner. Accordingly, it is possible to form the mask 100 with higher accuracy.

Third Embodiment

Figure 17:
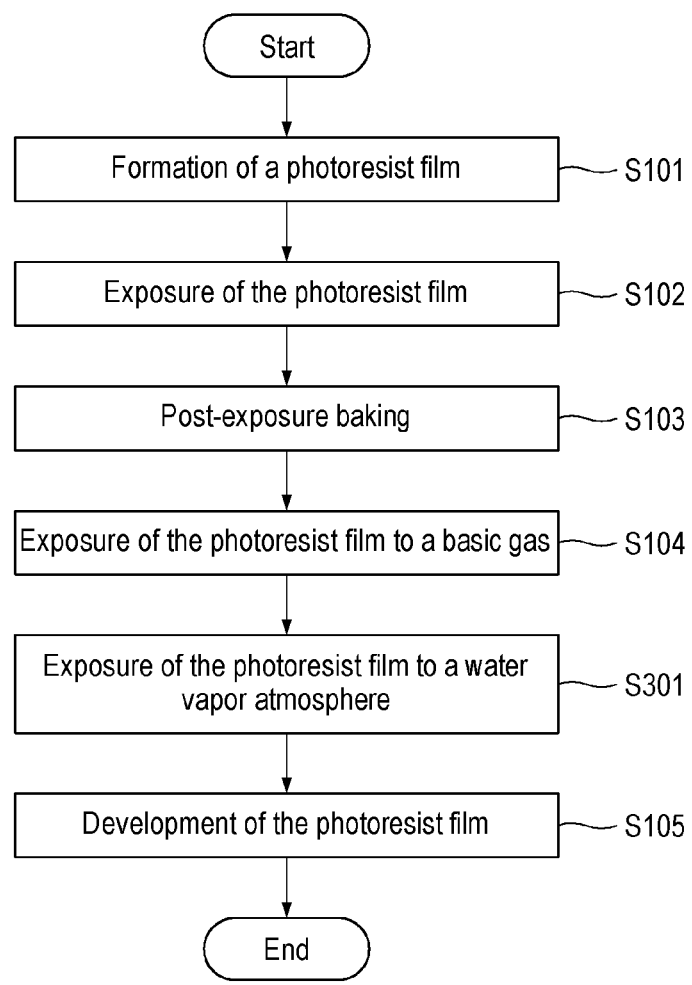
FIG. 17 is a flowchart showing a mask forming method according to a third embodiment.

Next, a third embodiment will be described. FIG. 17 is a flowchart illustrating a mask forming method according to a third embodiment.

The mask forming method according to the third embodiment includes a step of forming a photoresist film (step S101), a step of exposing the photoresist film (step S102) and a step of performing post-exposure baking (step S103). The mask forming method according to the third embodiment further includes a step of exposing the photoresist film to a basic gas (step S104), a step of exposing the photoresist film to a water vapor atmosphere (step S301) and a step of developing the photoresist film (step S105).

Hereinafter, the respective steps will be specifically described.

In steps S101 to S104, as in the first embodiment, the formation, exposure, post-exposure baking and exposure to the basic gas 113 of the photoresist film 102 are performed (see FIGS. 9A to 10B).

In step S301, the photoresist film 102 is exposed to the water vapor atmosphere. In step S104, the basic substance contained in the basic gas 113 penetrates into the exposed region 104. By exposing the photoresist film 102 to the water vapor atmosphere, water penetrates into the exposed region 104, whereby the hydrolysis of the basic substance is promoted. Therefore, the exposed region 104 can be made the water-soluble area 104A in a more reliable manner.

In step S105, the photoresist film 102A is developed as in the first embodiment (see FIG. 10C).

In this way, the mask 100 can be formed.

According to the third embodiment, as described above, the hydrolysis of the basic substance is promoted by the permeation of water into the exposed region 104. Therefore, the exposed region 104 can be made the water-soluble region 104A in a more reliable manner. Accordingly, it is possible to form the mask 100 with higher accuracy.

Fourth Embodiment

Next, a fourth embodiment will be described. FIG. 18 is a flowchart illustrating a mask forming method according to a fourth embodiment.

The mask forming method according to the fourth embodiment includes a step of forming a photoresist film (step S101), a step of exposing the photoresist film (step S102) and a step of performing post-exposure baking (step S103). The mask forming method according to the fourth embodiment further includes a step of forming a film containing a basic substance on the photoresist film (step S401), a step of heating the film containing the basic substance (step S402) and a step of developing the photoresist film (step S105).

Figure 19A:
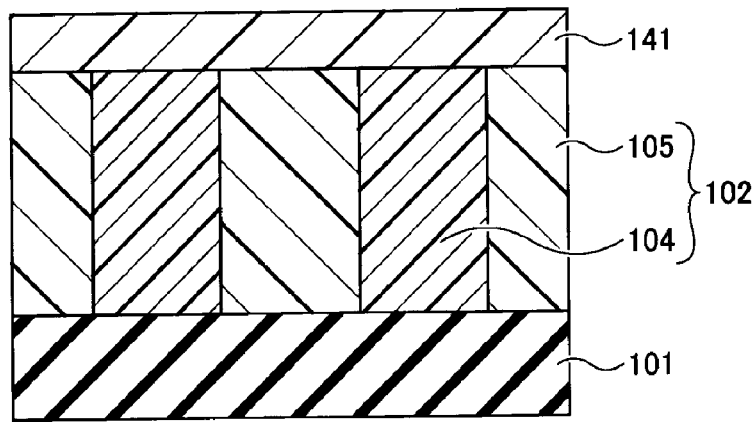
FIGS. 19A, 19B and 19C are sectional views showing the mask forming method according to the fourth embodiment.
Figure 19B:
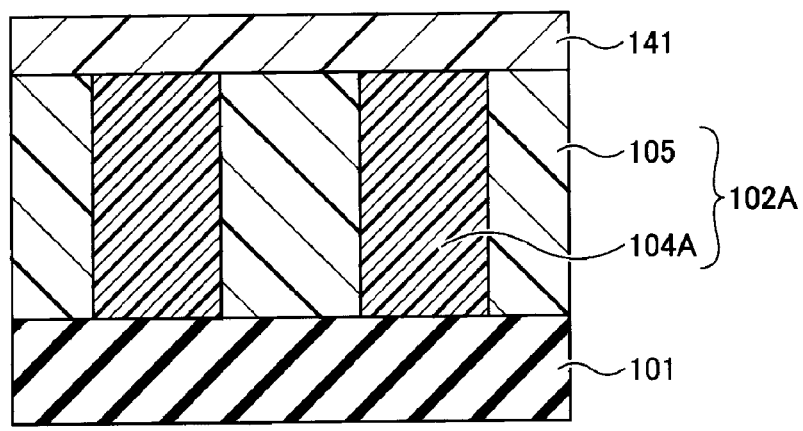
Figure 19C:
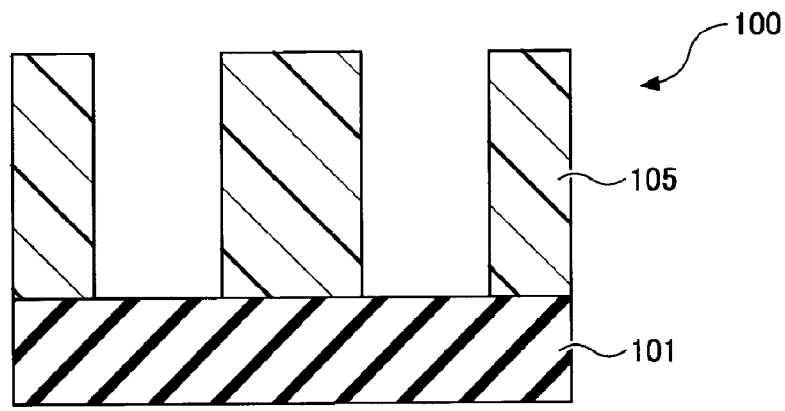

Hereinafter, the respective steps will be specifically described. FIGS. 19A, 19B and 19C are sectional views showing the mask forming method according to the fourth embodiment.

In steps S101 to S103, as in the first embodiment, the formation, exposure and post-exposure baking of the photoresist film 102 are performed (see FIGS. 9A to 9C).

In step S401, as shown in FIG. 19A, a film 141 (in a solid state) containing a basic substance is formed on the photoresist film 102. As the film 141, it may be possible to use, for example, a resin film in which a basic substance such as ammonia, methylamine, ethylamine, morpholine, pyridine or an arbitrary combination thereof is dissolved in a water-soluble polymer such as polyvinyl alcohol (PVA) or the like.

In step S402, the film 141 is heated. By heating the film 141, the basic substance contained in the film 141 permeates into at least the exposed region 104, whereby salts such as ammonium salts are generated by the reaction of the carboxyl group of the deprotected photoresist film 102 and the basic substance. These salts are soluble in water. However, the salts remain solid because there is no water around the salts. In this way, as shown in FIG. 19B, the solid photoresist film 102A in which the exposed region 104 becomes the water-soluble region 104A is obtained.

In step S105, as shown in FIG. 19C, the photoresist film 102A is developed as in the first embodiment.

In this way, the mask 100 can be formed.

Also in the fourth embodiment, the mask 100 onto which the pattern of the exposure mask 110 is transferred with high accuracy can be formed as in the first embodiment.

In each embodiment, an alkaline aqueous solution of TMAH or the like may be used as the developer.

According to the present disclosure in some embodiments, it is possible to improve the accuracy of a pattern.

Although the preferred embodiments have been described above in detail, the present disclosure is not limited to the above-described embodiments, and various modifications and substitutions may be made to the above-described embodiments without departing from the scope described in the claims.

What is claimed is:

1. A mask forming method, comprising:
   forming a photosensitive organic film on a workpiece;
   generating a first region and a second region in the photosensitive organic film by performing a selective exposure and a post-exposure baking on the photosensitive organic film, the first region having an acidic functional group in the photosensitive organic film, and the second region having a protective group in which the acidic functional group is protected;
   forming a salt in the first region by causing a basic substance to permeate into the first region using a substance staying in a gaseous state or a solid state; and
   removing the first region by dissolving the salt in a developer.

2. The method of claim 1, wherein the photosensitive organic film is exposed to a basic gas when causing the basic substance to permeate into the first region.

3. The method of claim 2, further comprising:
   exposing the photosensitive organic film to a water vapor atmosphere between the generating the first region and the second region and the removing the first region.

4. The method of claim 1, further comprising: when causing the basic substance to permeate into the first region, forming a film containing the basic substance on the photosensitive organic film, and heating the film to cause the basic substance to permeate from the film into the first region.

5. The method of claim 1, further comprising; when performing the selective exposure on the photosensitive organic film, irradiating the photosensitive organic film with an extreme ultraviolet light.

6. The method of claim 1, wherein the basic substance is ammonia, methylamine, ethylamine, morpholine, pyridine or an arbitrary combination thereof.

7. The method of claim 1, wherein a water or an alkaline aqueous solution is used as the developer.

* * * * *